United States Patent
Cho

(10) Patent No.: US 8,995,799 B2
(45) Date of Patent: Mar. 31, 2015

(54) OPTOELECTRONIC CHIPS INCLUDING COUPLER REGION AND METHODS OF MANUFACTURING THE SAME

(75) Inventor: Seong-ho Cho, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/474,809

(22) Filed: May 18, 2012

(65) Prior Publication Data

US 2013/0108209 A1    May 2, 2013

(30) Foreign Application Priority Data

Nov. 2, 2011    (KR) .................. 10-2011-0113581

(51) Int. Cl.
| | | |
|---|---|---|
| G02B 6/12 | (2006.01) | |
| G02B 6/125 | (2006.01) | |
| H01L 31/12 | (2006.01) | |
| G02B 6/42 | (2006.01) | |
| G02B 6/134 | (2006.01) | |

(52) U.S. Cl.
CPC .............. G02B 6/125 (2013.01); H01L 31/12 (2013.01); G02B 6/4214 (2013.01); G02B 6/1347 (2013.01)
USPC ............................................ 385/14; 385/130

(58) Field of Classification Search
USPC .................................................. 385/14, 130
See application file for complete search history.

(56) References Cited

U.S. PATENT DOCUMENTS

| | | | | |
|---|---|---|---|---|
| 4,529,267 A | * | 7/1985 | Nishioka et al. | 385/117 |
| 5,562,838 A | * | 10/1996 | Wojnarowski et al. | 216/24 |
| 5,882,468 A | * | 3/1999 | Crockett et al. | 156/345.3 |
| 6,351,576 B1 | * | 2/2002 | Ding | 385/14 |
| 7,001,788 B2 | * | 2/2006 | Leon et al. | 438/31 |
| 2002/0057862 A1 | * | 5/2002 | Okayama | 385/17 |
| 2004/0114860 A1 | * | 6/2004 | Dultz et al. | 385/31 |
| 2004/0136065 A1 | * | 7/2004 | Yoon et al. | 359/455 |
| 2004/0190826 A1 | * | 9/2004 | Ghiron et al. | 385/36 |
| 2004/0208438 A1 | * | 10/2004 | Faris | 385/31 |
| 2005/0054130 A1 | * | 3/2005 | Leon et al. | 438/31 |
| 2005/0070036 A1 | * | 3/2005 | Geusic et al. | 438/29 |
| 2006/0017991 A1 | * | 1/2006 | Poulsen | 359/20 |
| 2006/0023990 A1 | | 2/2006 | Shih et al. | |
| 2006/0104566 A1 | | 5/2006 | Bakir et al. | |

(Continued)

FOREIGN PATENT DOCUMENTS

| | | | |
|---|---|---|---|
| JP | 2002286958 A | 10/2002 | |
| JP | 2003167141 A | 6/2003 | |

(Continued)

OTHER PUBLICATIONS

Kobler, Johannes, "Thin Films from Porous Nanoparticles," Dissertation, Munich, 2008/.*

(Continued)

*Primary Examiner* — Peter Radkowski
(74) *Attorney, Agent, or Firm* — Harness, Dickey & Pierce, P.L.C.

(57) ABSTRACT

An optoelectronic chip including a coupler region, and a method of manufacturing the same, include a substrate; a coupler region formed of a material having a refractive index lower than the substrate and surrounded by the substrate. The coupler region includes a total reflection surface that totally reflects light incident through a surface of the substrate into the substrate or emits light guided in the substrate through the surface of the substrate.

9 Claims, 9 Drawing Sheets

(56) References Cited

U.S. PATENT DOCUMENTS

| | | | |
|---|---|---|---|
| 2006/0118897 A1* | 6/2006 | Jouan et al. | 257/432 |
| 2007/0217004 A1* | 9/2007 | Smith et al. | 359/456 |
| 2008/0031583 A1* | 2/2008 | Ohtsu et al. | 385/130 |
| 2009/0256224 A1* | 10/2009 | Coudrain et al. | 257/432 |
| 2010/0142885 A1 | 6/2010 | Shinoda et al. | |
| 2010/0142896 A1* | 6/2010 | Riester et al. | 385/88 |

FOREIGN PATENT DOCUMENTS

| | | |
|---|---|---|
| KR | 20090064952 A | 6/2009 |
| KR | 20110024098 A | 3/2011 |

OTHER PUBLICATIONS

Chung, et al., "Silicon-photonics light source realized by III-V/Si-grating-mirror laser," *Applied Physics Letters*, vol. 97, pp. 151113-1-151113-3 (2010).

Zheng, et al., "Optical proximity communication using reflective mirrors," *Optics Express*, vol. 16, No. 19, pp. 15052-15058 (Sep. 15, 2008).

Office Action for U.S. Appl. No. 13/768,204 dated Dec. 8, 2014.

\* cited by examiner

OPTOELECTRONIC CHIPS INCLUDING COUPLER REGION AND METHODS OF MANUFACTURING THE SAME

CROSS-REFERENCE TO RELATED APPLICATIONS

This application claims the benefit of priority from Korean Patent Application No. 10-2011-0113581, filed on Nov. 2, 2011, in the Korean Intellectual Property Office, the disclosure of which is incorporated herein by reference in its entirety.

BACKGROUND

1. Field

Example embodiments relate to optoelectronic chips including coupler regions and/or methods of manufacturing the same.

2. Description of the Related Art

Semiconductor integrated circuits (ICs) perform electrical communication by electrically transmitting and receiving data therebetween. Semiconductor ICs are integrated on a printed circuit board (PCB), and perform electrical communication via wires. There is a limitation in reducing electrical resistance between semiconductor ICs. Also, electrical communication may be affected by external magnetic waves. Accordingly, it is difficult to increase a transmission speed between semiconductor integrated circuits.

Optical interconnection, or optical communication, has recently been used in order to increase a transmission speed between semiconductor ICs. This is because if a signal exchanged between devices changes to an optical signal, there is little interference from external electromagnetic waves, and therefore high-speed communication is possible.

Couplers are widely used as devices configured for optical interconnection or optical communication between optical devices, between an optical device and an electronic device, or between semiconductor ICs. Various attempts have been made to reduce the loss of light and improve coupling efficiency.

Diffraction grating couplers, which are commonly used, need a technology for guaranteeing an exact grating period and have low optical coupling efficiency.

SUMMARY

Example embodiments relate to optoelectronic chips including coupler regions and/or methods of manufacturing the same.

In an example embodiment, there are provided optoelectronic chips including coupler regions.

In another example embodiment, there are provided methods of manufacturing the same.

Additional aspects will be set forth in part in the description which follows and, in part, will be apparent from the description, or may be learned by practice of the presented example embodiments.

According to an example embodiment, an optoelectronic chip includes a substrate; a coupler region formed of a material having a refractive index lower than a refractive index of the substrate and surrounded by the substrate. The coupler region includes a total reflection surface that totally reflects light incident through a surface of the substrate into the substrate or emits light guided in the substrate through the surface of the substrate.

The substrate may be a silicon substrate. The coupler region may be formed of silicon oxide.

The substrate may be a silicon-on-insulator (SOI) substrate including a buried oxide layer. The coupler region may be formed of silicon oxide. The coupler region may be on the buried oxide layer.

A width of the coupler region in a direction parallel to the surface of the substrate may be equal to, or greater than, about 500 nm.

The total reflection surface of the coupler region may be inclined at a desired (or, alternatively, predetermined) angle with respect to the surface of the substrate.

The coupler region may have a spherical shape and the total reflection surface may be a convex total reflection surface. The coupler region may have a cylindrical shape and the total reflection surface may be a convex total reflection surface.

The coupler region may be shaped in the form of a plurality of cylindrical shapes partially overlapping with one another in a direction inclined at a desired (or, alternatively, predetermined) angle with respect to the surface of the substrate. The plurality of cylindrical surfaces collectively may form the total reflection surface.

The optoelectronic chip may further include an optical fiber above the substrate and spaced apart from the substrate by a desired (or, alternatively, predetermined) distance. The optical fiber transmits the light incident through the surface of the substrate to the coupler region or transmits the light emitted by the coupler region from the surface of the substrate to an external device.

According to another example embodiment, a method of manufacturing an optoelectronic chip includes forming a coupler region in a substrate, wherein the coupler region is formed of a material having a refractive index lower than a refractive index of the substrate.

The forming a coupler region may include forming a pattern layer having a shape corresponding to a shape of the coupler region on the substrate; implanting ions into the substrate through the pattern layer; removing the pattern layer; and performing annealing on the substrate.

The forming a pattern layer may include forming a pattern material layer on the substrate; patterning the pattern material layer to have a width corresponding to a width of the pattern layer; and performing a thermal reflow process on the pattern material layer patterned to have the width.

The pattern layer may be formed of a material reflowable by heat. The pattern material layer may be formed of a photoresist material.

The implanting ions into the substrate may include implanting the ions into the substrate by using a mask exposing only a region corresponding to the pattern layer.

The substrate may be a silicon substrate, and the coupler region is formed of silicon oxide.

The substrate may be a silicon-on-insulator (SOI) substrate including a buried oxide layer. The coupler region is formed of silicon oxide and on the buried oxide layer.

The forming a coupler region may include partially etching the substrate to form a groove including an inclined surface; and coating a first material having a refractive index lower than a refractive index of the substrate on the inclined surface of the groove.

The first material may include one selected from silicon oxide, silicon nitride and a combination thereof.

A part of the groove may be filled with the first material. A remaining part of the groove may be filled with a second material having a refractive index higher than the refractive index of the first material.

The substrate may be formed of silicon (Si), wherein the second material is one selected from single-crystalline Si, amorphous silicon (a-Si), and poly silicon (poly-Si).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
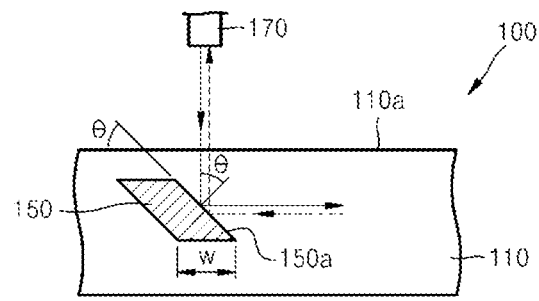
FIG. 1 is a cross-sectional view illustrating an optoelectronic chip according to an example embodiment.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to optoelectronic chips including coupler regions and/or methods of manufacturing the same.

FIG. 1 is a cross-sectional view illustrating an optoelectronic chip according to an example embodiment.

Referring to FIG. 1, an optoelectronic chip 100 includes a substrate 110 and a coupler region 150 embedded in (or, surrounded by) the substrate 110. The optoelectronic chip 100 including a plurality of optical devices or electronic devices includes the coupler region 150 for coupling optical signals between the optical devices or electronic devices. The plurality of optical devices or electronic devices may be disposed on the substrate 110, may be disposed in the substrate 110, or may be disposed above the substrate 110 to be spaced apart from the substrate 110. In FIG. 1, the coupler region 150 of the optoelectronic chip 100 is mainly illustrated. The optoelectronic chip 100 may further include an optical fiber 170 that transmits light to the coupler region 150 through a surface 110a of the substrate 110 or transmits light emitted from the surface 110a of the substrate 110 through the coupler region 150 to an external device.

The substrate 110 may be formed of a material such as silicon, GaAs, InP, or a conductive polymer, for example.

The coupler region 150 has a total reflection surface 150a that is formed of a material having a refractive index lower than a refractive index of the substrate 110, and that totally reflects light incident through the surface 110a of the substrate 110 into the substrate 110 or emits light guided in the substrate 110 through the surface 110a of the substrate 110. To this end, if the optoelectronic chip 100 is configured such that light is vertically incident on the surface 110a of the substrate 110, an angle θ between the totally reflective surface 150a and the surface 110a of the substrate 110 has to be greater than a critical angle for total reflection ($\sin^{-1}(n_2/n_1)$) by considering a relationship between a refractive index, $n_1$, of the substrate 110 and a refractive index, $n_2$, of the coupler region 150. If the substrate 110 is a silicon substrate, the coupler region 150 may be formed of silicon oxide.

The coupler region 150 is not limited to a shape shown in FIG. 1. The coupler region 150 may have any shape so long as the coupler region 150 has the total reflection surface 150a. A width, w, of the coupler region 150 may be appropriately determined by considering coupling efficiency, and may be, for example, about 0.5 μm or more.

Figure 2A:
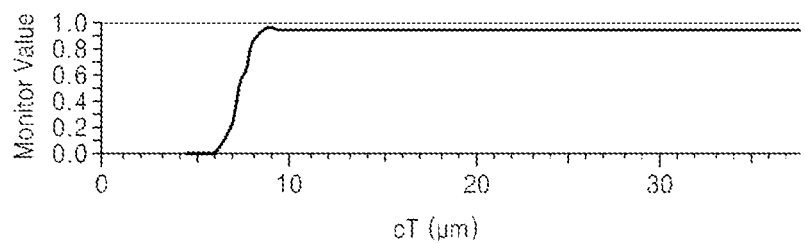
FIGS. 2A and 2B are numerical simulation graphs illustrating coupling efficiency when a width of a coupler region included in the optoelectronic chip of FIG. 1 is 2 μm and 0.5 μm, respectively.
Figure 2B:
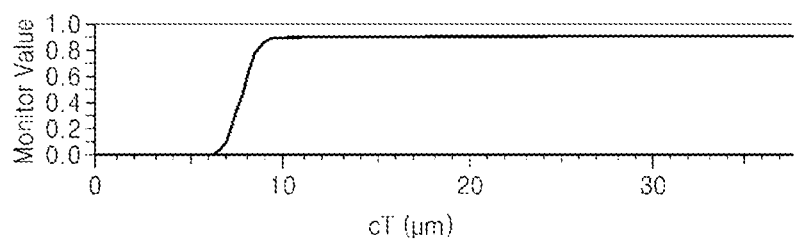

FIGS. 2A and 2B are numerical simulation graphs illustrating coupling efficiency when the width, w, of the coupler region included in the optoelectronic chip of FIG. 1 is 2 μm and 0.5 μm, respectively.

Coupling efficiency refers to a ratio of the amount of light horizontally coupled to the total amount of light vertically incident on the surface of the substrate. A horizontal axis of each graph represents a distance in a direction parallel to the surface of the substrate inside the substrate.

Referring to FIG. 2A, when the width w of the coupler region 150 is 2 μm, and the coupling efficiency is almost 100%.

Referring to FIG. 2B, when the width w of the coupler region 150 is 0.5 μm, and the coupling efficiency is equal to or higher than 90%.

Figure 3:
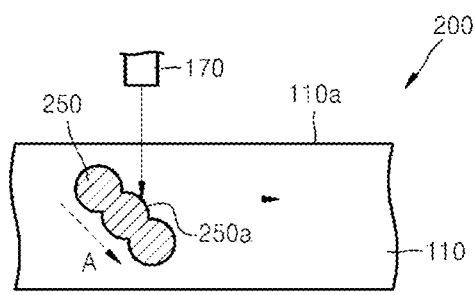
FIG. 3 is a cross-sectional view illustrating an optoelectronic chip according to another example embodiment.
Figure 4:
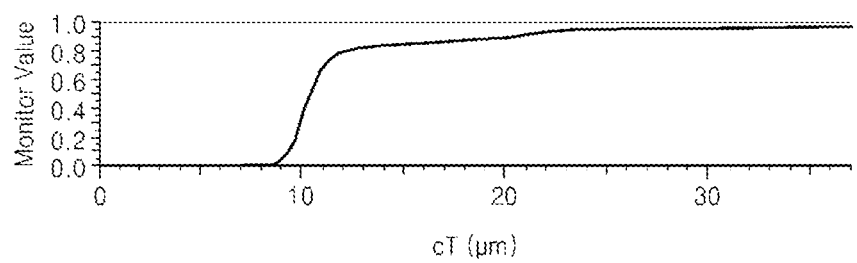
FIG. 4 is a numerical simulation graph illustrating the coupling efficiency of a coupler region included in the optoelectronic chip of FIG. 3.

FIG. 3 is a cross-sectional view illustrating an optoelectronic chip according to another example embodiment. FIG. 4 is a numerical simulation graph illustrating the coupling efficiency of a coupler region included in the optoelectronic chip of FIG. 3.

Referring to FIG. 3, an optoelectronic chip 200 is different from the optoelectronic chip shown in FIG. 1 in terms of a shape of a coupler region 250. The coupler region 250 may have a cylindrical shape, and a cylindrical surface may be a total reflection surface 250a. The coupler region 250 may be formed such that a plurality of cylindrical shapes partially overlap with one another in an A direction inclined at a desired (or, alternatively, predetermined) angle with respect to the surface 250a of the substrate 110. The plurality of cylindrical surfaces are connected to collectively form the total reflection surface 250a.

Referring to FIG. 4, the coupling efficiency of the optoelectronic chip 200 is almost 100%.

Figure 5:
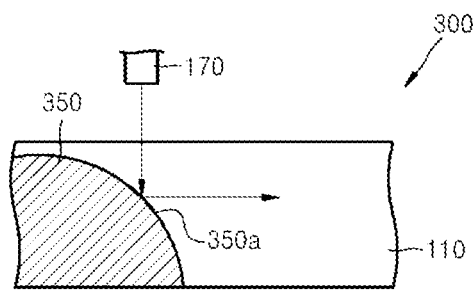
FIG. 5 is a cross-sectional view illustrating an optoelectronic chip according to yet another example embodiment.
Figure 6:
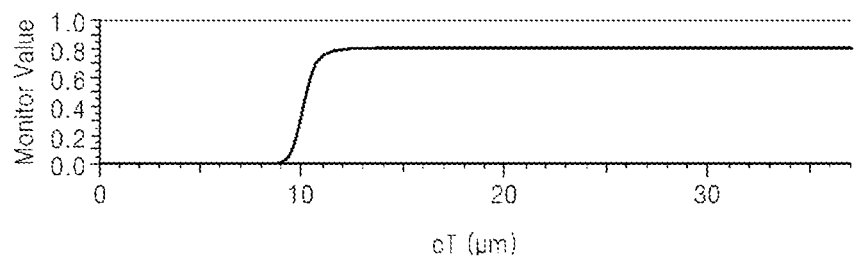
FIG. 6 is a numerical simulation graph illustrating the coupling efficiency of a coupler region included in the optoelectronic chip of FIG. 5.

FIG. 5 is a cross-sectional view illustrating an optoelectronic chip according to yet another example embodiment. FIG. 6 is a numerical simulation graph illustrating the coupling efficiency of a coupler region included in the optoelectronic chip of FIG. 5.

Referring to FIG. 5, an optoelectronic chip 300 includes a coupler region 350 having a spherical shape. A spherical surface is a total reflection surface 350a. The coupling efficiency is about 80%.

Figure 7:
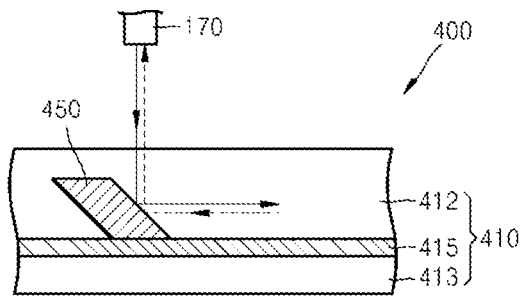
FIG. 7 is a cross-sectional view illustrating an optoelectronic chip according to a further example embodiment.
Figure 8:
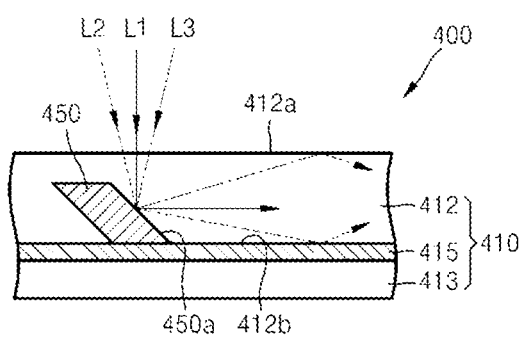
FIG. 8 is a cross-sectional view illustrating a coupling path according to a tolerance regarding an angle of light incident on a coupler region included in the optoelectronic chip of FIG. 7.

FIG. 7 is a cross-sectional view illustrating an optoelectronic chip according to a further example embodiment. FIG. 8 illustrates a coupling path according to a tolerance regarding an angle of light incident on a coupler region included in the optoelectronic chip of FIG. 7.

Referring to FIG. 7, an optoelectronic chip 400 is configured such that a coupler region 450 is formed in a silicon-on-insulator (SOI) substrate 410 including a buried oxide layer 415. The coupler region 450 may be formed on the buried oxide layer 415, and may be formed of silicon oxide. Silicon layers 412 and 413 are disposed over and under the buried oxide layer 415, respectively. Also, if the silicon layer 412 is formed of silicon (Si), the coupler region 450 may be formed of amorphous silicon (a-Si) or poly silicon (poly-Si).

The SOI substrate 410, which is commonly used to form a semiconductor integrated circuit (IC), an optical IC, or an optoelectronic IC, may be formed by using separation by implantation of oxygen (SIMOX).

Referring to FIG. 8, because the coupler region 450 is a low refractive index region and the buried oxide layer 415 is also a low refractive index region compared to the silicon layer 412, both surfaces 412a and 412b of the silicon layer 412 become total reflection surfaces. Thus, the silicon layer 412 acts (or, functions) as a waveguide for guiding light. An angle of a total reflection surface 450a of the coupler region 450 is designed based on light L1 vertically incident on a surface of the SOI substrate 410. Even when light L2 and light L3 which are tilted to some extent are incident, the coupled light is guided into the SOI substrate 410. Although the description is given assuming that incident light is tilted, even when the total reflection surface 450a is somewhat different from a designed one, the coupled light may be guided using the same principle.

Although the coupler region 450 of FIG. 7 has the same shape as that of the coupler region 150 of FIG. 1, the coupler region 250 or 350 as shown in FIG. 3 or 5 may be formed on the buried oxide layer 415 of the SOI substrate 410.

FIGS. 9A through 9H are cross-sectional views for explaining a method of manufacturing an optoelectronic chip, according to an example embodiment.

The optoelectronic chip manufactured by the method includes a coupler region that is formed in a substrate and is formed of a material having a refractive index lower than that of the substrate. The method includes preparing the substrate and forming the coupler region in the substrate, wherein the coupler region is formed of a material having a refractive index lower than that of the substrate.

In order to form the coupler region, a pattern layer having a shape corresponding to a shape of the coupler region is formed on the substrate.

A method of forming the pattern layer is illustrated in FIGS. 9A through 9D.

Figure 9A:
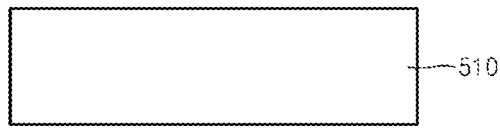
FIGS. 9A through 9H are cross-sectional views for explaining a method of manufacturing an optoelectronic chip, according to an example embodiment.

Referring to FIG. 9A, a substrate 510 is prepared. The substrate 510 may be formed of a material such as silicon, GaAs, InP, or a conductive polymer.

Figure 9B:
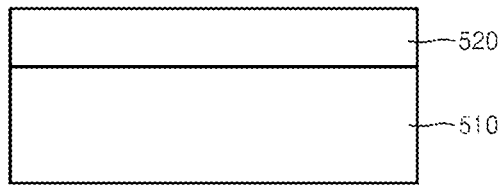

Referring to FIG. 9B, a pattern material layer 520 is coated on the substrate 510. The pattern material layer 520 may be formed of a material that can be reflowed by heat, for example, a photoresist.

Figure 9C:
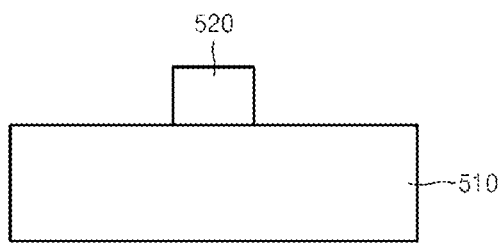
Figure 9D:
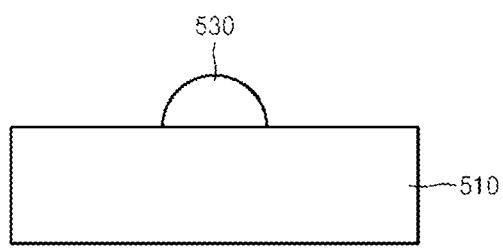

Referring to FIG. 9C, the pattern material layer 520 is patterned to have a width corresponding to the width of a pattern layer 530 shown in FIG. 9D.

Referring to FIG. 9D, a thermal reflow process is performed on the pattern material layer 520 patterned to have the desired (or, alternatively, predetermined) width and the pattern layer 530 is formed. The pattern layer 530 may have a semi-spherical shape or a semi-cylindrical shape but the present example embodiment is not limited thereto.

Figure 9E:
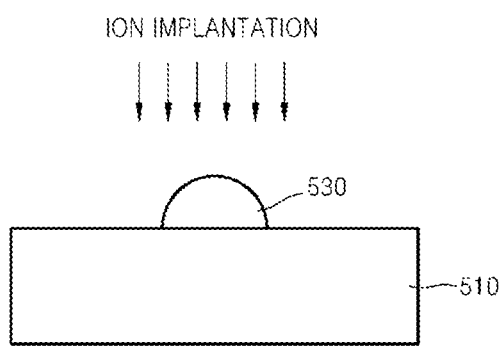

Referring to FIG. 9E, ions are implanted into the substrate 510 through the pattern layer 530.

Figure 9F:
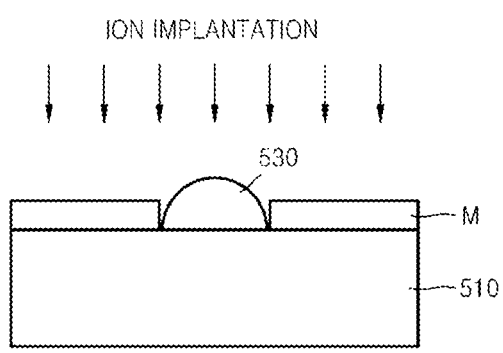

Referring to FIG. 9F, the ions may be implanted by using a mask M in which only a region corresponding to the pattern layer 530 is opened (or, exposed).

Figure 9G:
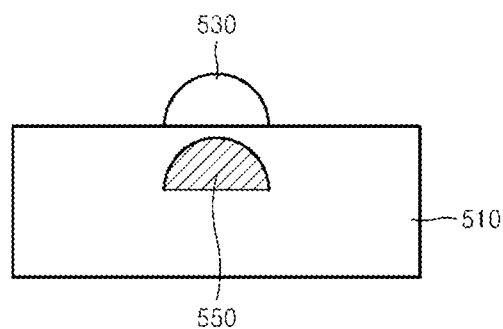

Referring to FIG. 9G, a coupler region 550 is formed. The coupler region 550 has a refractive index lower than a refractive index of the substrate 510. For example, if the substrate 510 is formed of silicon, the coupler region 550 formed of silicon oxide may be formed by implanting oxygen ions. The substrate 510 may be an SOI substrate including a buried oxide layer. In this case, the coupler region 550 formed of silicon oxide may be formed on the buried oxide layer.

Figure 9H:
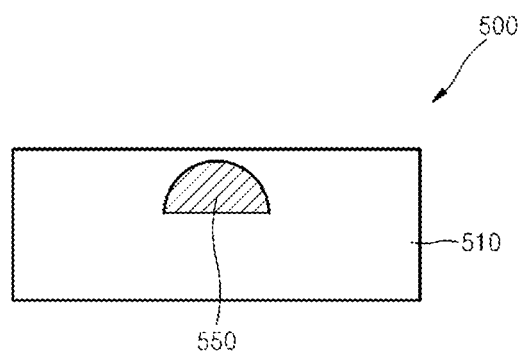

Referring to FIG. 9H, the pattern layer 530 is removed and annealing is performed on the substrate 510 including the coupler region 550 to realize an optoelectronic chip 500 including the coupler region 550.

Although the coupler region 550 in FIGS. 9A through 9H is manufactured to have one semi-spherical shape or semi-cylindrical shape, the coupler region 550 including a plurality of semi-spherical or semi-cylindrical shapes may be formed in the substrate 510 by repeatedly performing operations of FIGS. 9B through 9G by changing a position of the pattern layer 530 after an operation of FIG. 9H.

Although ion implantation is performed by using the pattern layer 530 having a shape corresponding to a shape of the coupler region 550 in FIGS. 9A through 9H, the shape of the coupler region 550 may be adjusted by appropriately adjusting ion implantation conditions (e.g., implantation angle, energy, and dose) without using the pattern layer 530.

FIGS. 10A through 10D are cross-sectional views for explaining a method of manufacturing an optoelectronic chip, according to another example embodiment.

In order to form a coupler region, the method includes etching a part of a substrate, and filling the etched part with a material having a refractive index lower than a refractive index of the substrate.

Figure 10A:
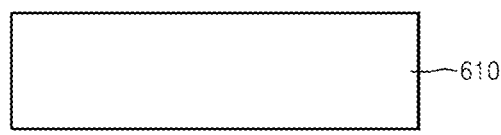
FIGS. 10A through 10D are cross-sectional views for explaining a method of manufacturing an optoelectronic chip, according to another example embodiment.

Referring to FIG. 10A, a substrate 610 is prepared. The substrate 610 may be an SOI substrate, or may be formed of a material such as silicon, GaAs, InP, or a conductive polymer.

Figure 10B:
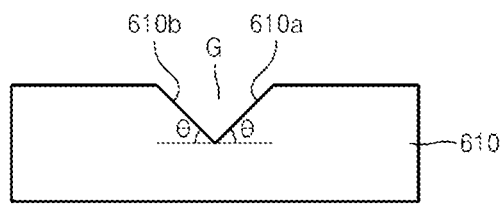

Referring to FIG. 10B, a groove G is formed by etching a part of the substrate 610. If the substrate 610 is formed of silicon (Si), the groove G, which has an inverted pyramid shape and including inclined surfaces 610a and 610b that are inclined at an angle θ, is formed by wet etching. The angle θ is about 54.7°. One of the inclined surfaces 610a and 610b is used as a total reflection surface of a coupler region 650.

Figure 10C:
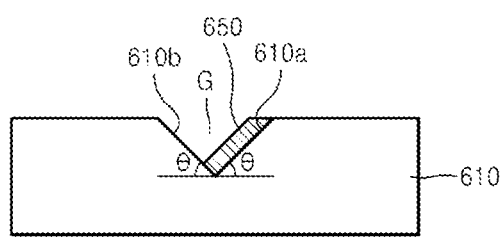

Referring to FIG. 10C, a coupler region 650 may be formed by coating a first material having a refractive index lower than a refractive index of the substrate 610 on the inclined surface 610a to fill in a part of the groove G. The coupler region 650 may have a thickness of about 100 nm to 1 μm. The first material may be silicon oxide or silicon nitride.

Figure 10D:
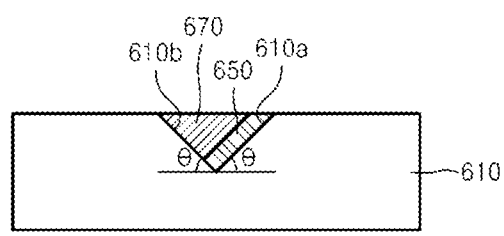

Referring to FIG. 10D, a remaining part of the groove G is filled with a second material 670. The second material 670 has a refractive index higher than the refractive index of the first material of the coupler region 650. For example, the second material 670 may be a material similar or identical to the material of the substrate 610. The substrate 610 may be formed of Si, and the second material 670 may be formed of silicon-crystalline Si, a-Si, or poly-Si.

Figure 11A:
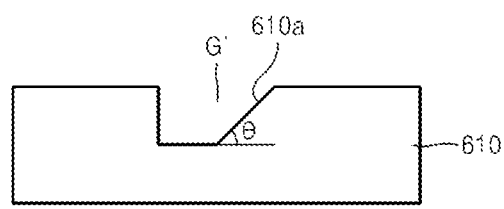
FIGS. 11A through 11C are cross-sectional views for explaining a method of manufacturing an optoelectronic chip, according to yet another example embodiment.
Figure 11B:
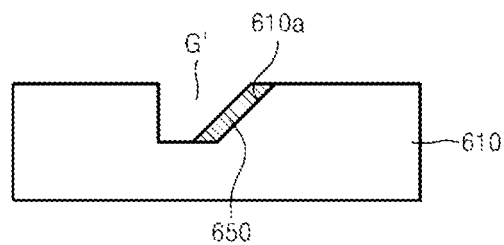
Figure 11C:
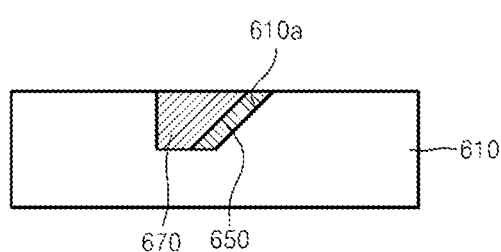

FIGS. 11A through 11C are cross-sectional views for explaining a method of manufacturing an optoelectronic chip, according to yet another example embodiment.

Like reference numerals are used for elements substantially identical to elements of FIGS. 10A through 10D, and thus, detailed descriptions thereof will not be repeated.

Referring to FIG. 11A, the inclined surface 610b may be further etched by using dry etching to form a groove G'.

Referring to FIG. 11B, the coupler region 650 may be formed by coating the first material (e.g., silicon oxide or silicon nitride) having a refractive index lower than a refractive index of the substrate 610 on the inclined surface 610a to fill in a part of the groove G'.

Referring to FIG. 11C, a remaining part of the groove G' is filled with the second material 670. The second material 670 has a refractive index higher than the refractive index of the first material of the coupler region 650. For example, the second material 670 may be a material similar or identical to the material of the substrate 610. The substrate 610 may be formed of Si, and the second material 670 may be formed of single-crystalline Si, a-Si, or poly-Si.

The optoelectronic chip in may be manufactured to have a similar shape to that of FIG. 7 by forming the coupler region 650 on a buried oxide layer using an SOI substrate as the substrate 610.

Vertical coupling of incident light may be achieved by allowing a total reflection surface to be formed of a material having a refractive index lower than a refractive index of a substrate in the substrate to have high coupling efficiency.

The optoelectronic chip exhibits a stable coupling performance despite a manufacturing tolerance regarding an angle of a total reflection surface or a tolerance regarding an angle of incident light.

The method of manufacturing the optoelectronic chip may form a coupler region having a desired shape in a substrate by implanting ions by using a pattern layer corresponding to a shape of the coupler region. Also, the shape of the coupler region may be adjusted by using ion implantation conditions.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An optoelectronic chip, comprising:
a substrate including a first layer, a second layer and a third layer, sequentially stacked,
the first layer having a first surface and a second surface,
the first surface being an interface with outside, and
the second surface being an interface with the second layer; and
a coupler region formed of a material having a refractive index lower than a refractive index of the first layer and surrounded by the first layer,
the coupler region including a total reflection surface at an interface with the first layer, the total reflection surface totally reflecting light incident through the first surface of the first layer into the first layer or emitting light guided in the first layer through the first surface of the first layer.

2. The optoelectronic chip of claim 1, wherein the substrate is a silicon-on-insulator (SOI) substrate in which the first layer is an upper silicon layer, the third layer is a lower silicon layer, and the second layer is buried oxide layer between the upper silicon layer and the lower silicon layer.

3. The optoelectronic chip of claim 2, wherein the coupler region is formed of silicon oxide.

4. The optoelectronic chip of claim 1, wherein a width of the coupler region in a direction parallel to the first surface of the first layer is equal to, or greater than, about 500 nm.

5. The optoelectronic chip of claim 1, wherein the total reflection surface of the coupler region is inclined at a desired angle with respect to the first surface of the first layer.

6. The optoelectronic chip of claim 1, wherein,
the coupler region has a spherical shape, and
the total reflection surface is a convex total reflection surface.

7. The optoelectronic chip of claim 1, wherein,
the coupler region has a cylindrical shape, and
the total reflection surface is a convex total reflection surface.

8. The optoelectronic chip of claim 1, wherein,
the coupler region is shaped in the form of a plurality of cylindrical shapes partially overlapping with one another in a direction inclined at a desired angle with respect to the first surface of the first layer,
wherein the plurality of cylindrical shapes collectively forms the total reflection surface.

9. The optoelectronic chip of claim 1, further comprising:
an optical fiber above the substrate and spaced apart from the first surface of the first layer by a desired distance,
the optical fiber transmitting the light incident through the first surface of the first layer to the coupler region or transmitting the light emitted by the coupler region from the first surface of the first layer through to an external device.

* * * * *